(12) United States Patent  
Kent (10) Patent No.: US 8,982,613 B2
(45) Date of Patent: Mar. 17, 2015

(54) SCALABLE ORTHOGONAL SPIN TRANSFER MAGNETIC RANDOM ACCESS MEMORY DEVICES WITH REDUCED WRITE ERROR RATES

(71) Applicant: New York University, New York, NY (US)

(72) Inventor: Andrew Kent, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 13/919,466

(22) Filed: Jun. 17, 2013

(65) Prior Publication Data

US 2014/0367812 A1 Dec. 18, 2014

(51) Int. Cl.
*G11C 11/00* (2006.01)
*H01L 43/02* (2006.01)
*H01L 27/22* (2006.01)

(52) U.S. Cl.
CPC .............. *H01L 43/02* (2013.01); *H01L 27/222* (2013.01)
USPC .......................................................... 365/158

(58) Field of Classification Search
CPC ...... G11C 11/14; G11C 11/15; G11C 11/155; G11C 11/16; G11C 11/161
USPC .................................. 365/171, 173; 257/421
See application file for complete search history.

(56) References Cited

U.S. PATENT DOCUMENTS

| 5,541,868 | A | 7/1996 | Prinz |
| 5,629,549 | A | 5/1997 | Johnson |
| 5,640,343 | A | 6/1997 | Gallagher et al. |
| 5,654,566 | A | 8/1997 | Johnson |
| 5,691,936 | A | 11/1997 | Sakakima et al. |
| 5,695,846 | A | 12/1997 | Lange et al. |
| 5,695,864 | A | 12/1997 | Slonczewski et al. |
| 5,856,897 | A | 1/1999 | Mauri |
| 5,896,252 | A | 4/1999 | Kanai |
| 5,966,323 | A | 10/1999 | Chen et al. |

(Continued)

FOREIGN PATENT DOCUMENTS

| CA | 2766141 | 1/2011 |
| EP | 1 345 277 A1 | 9/2003 |

(Continued)

OTHER PUBLICATIONS

Firastrau et al., "Spin-torque nano-oscillator based on a synthetic antiferromagnet free layer and perpendicular to plane polarizer", J. Appl. Phys. 113, 113908 (2013).*

(Continued)

*Primary Examiner* — Anthan Tran
(74) *Attorney, Agent, or Firm* — Foley & Lardner LLP (57) ABSTRACT

A magnetic device includes a pinned polarizing magnetic layer having a magnetic vector parallel to a plane of the pinned polarizing magnetic layer. The magnetic device also includes a free layer, separated from the polarizing magnetic layer by a first non-magnetic layer, having a magnetization vector with a changeable magnetization direction. The changeable magnetization vector is configured to change to a first state upon application of a first current of a first polarity and to change to a second state upon application of a second current of a second, opposite polarity. The magnetic device also has a reference layer having a magnetic vector perpendicular to the plane of the reference layer and separated from the free layer by a second non-magnetic layer.

14 Claims, 7 Drawing Sheets

(56) References Cited

U.S. PATENT DOCUMENTS

| | | | |
|---|---|---|---|
| 6,016,269 A | 1/2000 | Peterson et al. |
| 6,055,179 A | 4/2000 | Koganei et al. |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun et al. |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,447,935 B1 | 9/2002 | Zhang et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,563,681 B2 | 5/2003 | Sasaki et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,807,091 B2 | 10/2004 | Saito |
| 6,812,537 B2 | 11/2004 | Okazawa et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,879,512 B2 | 4/2005 | Luo |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,956,257 B2 | 10/2005 | Zhu et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,009,877 B1 | 3/2006 | Huai et al. |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,161,829 B2 | 1/2007 | Huai et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,307,876 B2 | 12/2007 | Kent et al. |
| 7,313,015 B2 | 12/2007 | Bessho |
| 7,369,427 B2 | 5/2008 | Diao et al. |
| 7,515,458 B2 | 4/2009 | Hung et al. |
| 7,532,503 B2 | 5/2009 | Morise et al. |
| 7,573,737 B2 | 8/2009 | Kent et al. |
| 7,576,956 B2 | 8/2009 | Huai |
| 7,602,000 B2 | 10/2009 | Sun et al. |
| 7,663,171 B2 | 2/2010 | Inokuchi et al. |
| 7,936,598 B2 | 5/2011 | Zheng et al. |
| 8,344,433 B2 | 1/2013 | Zhu et al. |
| 8,477,530 B2 | 7/2013 | Ranjan et al. |
| 2002/0105823 A1* | 8/2002 | Redon et al. ............... 365/97 |
| 2005/0128842 A1 | 6/2005 | Wei |
| 2005/0136600 A1 | 6/2005 | Huai |
| 2007/0019337 A1 | 1/2007 | Apalkov et al. |
| 2008/0297292 A1 | 12/2008 | Viala et al. |
| 2009/0072185 A1 | 3/2009 | Raksha et al. |
| 2009/0098413 A1 | 4/2009 | Kanegae |
| 2009/0141540 A1 | 6/2009 | Miura et al. |
| 2010/0124091 A1 | 5/2010 | Cowburn et al. |
| 2010/0134923 A1 | 6/2010 | Clinton et al. |
| 2010/0140726 A1* | 6/2010 | Apalkov et al. ............ 257/421 |
| 2010/0226169 A1* | 9/2010 | Gao et al. .................. 365/171 |
| 2011/0007560 A1* | 1/2011 | Dieny et al. ................ 365/171 |
| 2011/0141791 A1* | 6/2011 | Ahmed ........................ 365/94 |
| 2012/0063218 A1 | 3/2012 | Huai et al. |
| 2012/0069646 A1* | 3/2012 | Kramer et al. ............. 365/171 |
| 2012/0261776 A1* | 10/2012 | Tang et al. ................. 257/421 |
| 2012/0280338 A1 | 11/2012 | Abraham et al. |
| 2013/0062715 A1 | 3/2013 | Chen et al. |
| 2013/0075845 A1* | 3/2013 | Chen et al. ................. 257/421 |
| 2014/0008742 A1* | 1/2014 | Chen et al. ................. 257/421 |

FOREIGN PATENT DOCUMENTS

| | | |
|---|---|---|
| FR | 2817998 | 6/2002 |
| JP | 01-004012 A | 1/1998 |
| JP | 11-120758 | 4/1999 |
| JP | 11-353867 | 12/1999 |
| JP | 2001-195878 A | 7/2001 |
| JP | 2002-261352 | 9/2002 |
| JP | 2002-357489 | 12/2002 |
| JP | 2003-318461 | 11/2003 |
| JP | 2005-150482 | 6/2005 |
| JP | 2005-535111 | 11/2005 |
| JP | 2006-128579 | 5/2006 |
| JP | 2008-524830 A | 7/2008 |
| JP | 2009-027177 | 2/2009 |
| WO | WO-2009/080636 | 7/2009 |

OTHER PUBLICATIONS

Stiles et al., "Spin-Transfer Torque and Dynamic", Spin Dynamics in Confined Magnetic Structures III, Topics in Applied Physics vol. 101, pp. 225-308 (2006).*

Second Notification of Provisional Rejection for Korean Patent Application No. 10-2012-7001872, dated Dec. 30, 2013, 37 pages.

First Office Action (with English Translation) in Japanese Patent Application No. 2006-524031, dated May 10, 2011, (9 pgs.).

Lee et al., Analytical investigation of spin-transfer dynamics using a perpendicular-to-plane polarizer., Applied Physics Letters, 86, pp. 022505-022505-3, 2005.

Martens et al., "Magnetic Reversal in nanoscopic Ferromagnetic Rings", NSF grants PHY-0351964 (DLS), 2006, 23 pages.

Martens et al., "Thermally Induced Magnetic Switching in Thin Ferromagnetic Annuli", NSF grants PHY-0351964 (DLS), 2005, 11 pages.

Non-Final Office Action for U.S. Appl. No. 13/298,190, dated Jul. 2, 2013, (20 pgs.).

Non-Final Office Action on U.S. Appl. No. 13/720,290, dated May 14, 2013, (20 pgs.).

Notice of Allowance on U.S. Appl. No. 12/490,588, dated Feb. 3, 2011, (11 pgs.).

Notice of Allowance on U.S. Appl. No. 13/041,104, dated Sep. 21, 2012, (7pgs.).

Notice of Reasons for Rejection received for JP 2012-043157 dated Sep. 3, 2013.

Notification of Provisional Rejection received for Korean Appln. No. 10-2012-7001872 mailed Jun. 5, 2013.

(56) References Cited

OTHER PUBLICATIONS

Notification of Reasons for Refusal received in Japanese Appln. No. 2012-517632 dated Jul. 17, 2013.
Office Action for Canadian Application No. 2,766,141, dated Sep. 4, 2013, 4 pages.
Office Action issued by the Chinese Patent Office, Oct. 29, 2012, Chinese Application No. 200880119942.4, 10 pages.
Office Action on U.S. Appl. No. 13/041,104, dated Apr. 6, 2012, (17 pgs.).
Office Action received for JP 2010-531338 dated Jun. 18, 2013.
Supplementary European Search Report received for EP 10797550.0 completed Jul. 22, 2013 and mailed Sep. 16, 2013.
US Notice of Allowance for U.S. Appl. No. 13/298,190 dated Sep. 30, 2013.
US Notice of Allowance for U.S. Appl. No. 13/720,290 dated Oct. 25, 2013.
International Preliminary Report on Patentability for PCT/US2010/039373 dated Jan. 4, 2012, 4 pages.
Notification of Provisional Rejection received from Korean App. No. 10-2013-7023576 mailed Oct. 22, 2013.
Decision of Rejection dated Mar. 18, 2014 for Japanese App. No. 2012-043157, 5 pages.
Office Action for Canadian application No. 2,766,141 dated May 22, 2014, 3 pages.
Notification of Transmittal of the International Search Report and The Written Opinion of the International Searching Authority, or the Declaration for PCT/US2014/42135, dated Oct. 23, 2014, 8 pages.
Ingvarsson, S., et al., "Tunable magnetization damping in transition metal ternary alloys", Applied Physics Letters, vol. 85, No. 21, Nov. 22, 2004., pp. 4995-4997.
Office Action for Canada App. No. 2,535,965, dated Dec. 12, 2014, 3 pages.
Notification of Provisional Rejection for Korean App. No. 10-2010-7011550, dated Dec. 10, 2014, 6 pages.
Notification of Reasons of Refusal for Japanese App. No. 2013-257366, dated Dec. 3, 2014, 3 pages.

* cited by examiner

SCALABLE ORTHOGONAL SPIN TRANSFER MAGNETIC RANDOM ACCESS MEMORY DEVICES WITH REDUCED WRITE ERROR RATES

BACKGROUND

Orthogonal spin transfer magnetic random access memory devices offer fast (sub-nanosecond) initiations of the magnetization write process, combined with low energy operation. These devices employ at least two thin magnetic layers whose preferred magnetization directions are not oriented along the same axis (i.e. not collinear). This assures that a spin-transfer torque acts on a switchable magnetic layer (free layer) of the device when a write pulse (a voltage or current pulse) is applied to a device.

SUMMARY

In general, one aspect of the subject matter described in this specification can be embodied in a magnetic device includes a pinned polarizing magnetic layer having a magnetic vector parallel to a plane of the pinned polarizing magnetic layer. The magnetic device also includes a free layer, separated from the polarizing magnetic layer by a first non-magnetic layer, having a magnetization vector with a changeable magnetization direction. The changeable magnetization vector is configured to change to a first state upon application of a first current of a first polarity and to change to a second state upon application of a second current of a second, opposite polarity. The magnetic device also has a reference layer having a magnetic vector perpendicular to the plane of the reference layer and separated from the free layer by a second non-magnetic layer. Other implementations of this aspect include corresponding systems, memory arrays, and apparatuses.

The foregoing summary is illustrative only and is not intended to be in any way limiting. In addition to the illustrative aspects, implementations, and features described above, further aspects, implementations, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

An orthogonal spin transfer magnetic random access memory device generally consists of a polarizing magnetic layer oriented orthogonally to a free layer and includes a reference magnetic layer. These magnetic layers are separated by thin non-magnetic metallic or insulating layers. Described herein, are orthogonal spin transfer magnetic random access memory devices that can be reduced in lateral size to the nanometer scale, e.g., ~3 nanometers (nm), while maintaining the following characteristics for a memory devices: long term stability of the magnetic states used to represent data; reduced write error rates for short (sub nanosecond) write pulses; and reduced interaction between magnetic devices in a densely packed memory array. In some described implementations, an orthogonal spin transfer magnetic random access memory device uses balanced switching currents such that the switching currents for writing "1" and "0" states are of similar magnitude. Multiple stable states of the free layer can be envisioned that would enable one device to store more than one bit of information.

Figure 1:
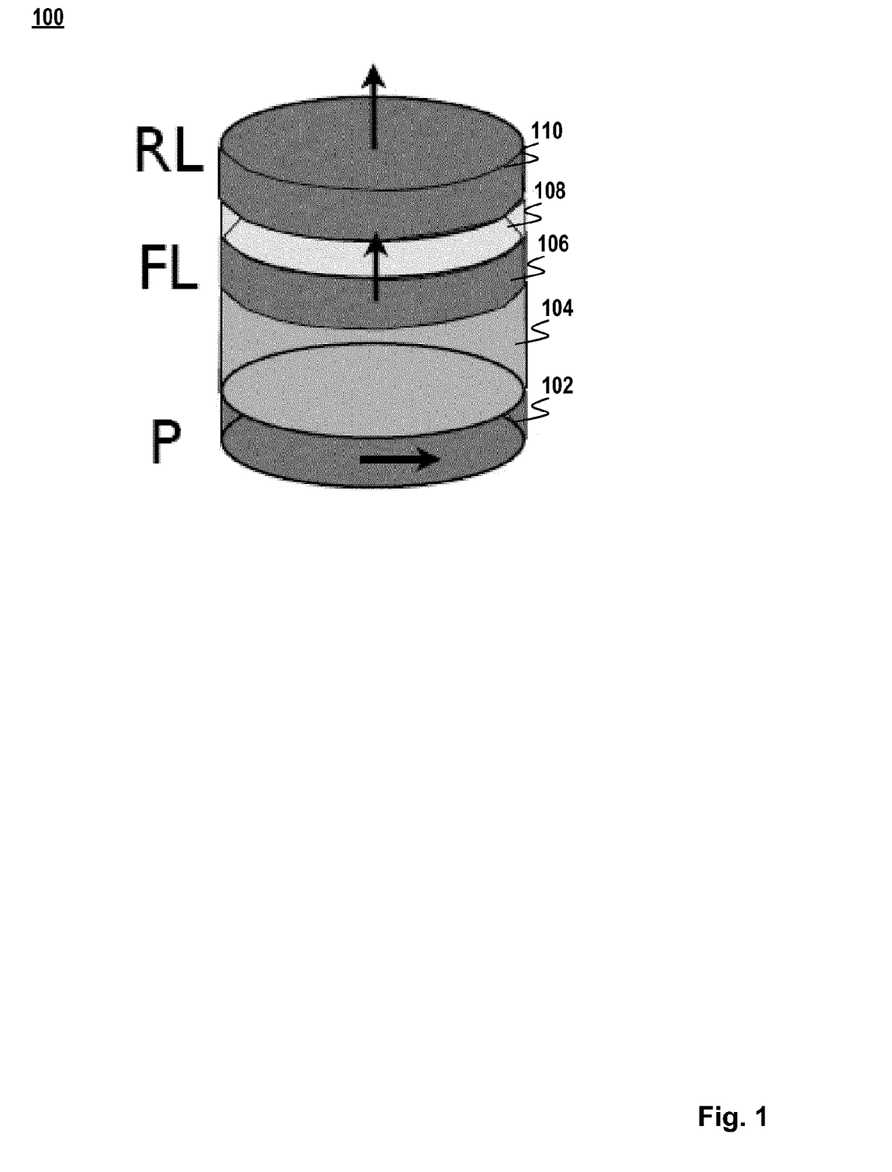
FIG. 1 shows an orthogonal spin transfer magnetic random access memory device in accordance with an illustrative implementation.

In some implementations, a memory device can be configured such that the write current polarity determines the bit state, e.g., a positive polarity pulse for a sub-nanosecond duration sets the "1" state and a negative polarity pulse for a sub-nanosecond duration sets the "0" state. In one implementation, the memory device shape can have a circular cross-section. In contrast, when the free layer is magnetized in-plane the free layer must have an asymmetric shape, because magnetic shape anisotropy is used to stabilize the magnetic states (i.e. to set energy barrier separating the "left" and "right" magnetized magnetic states of the free layer.) Each layer is thin enough that it can be referred to as a plane. Accordingly, a magnetization field that is "in-plane" means a magnetization field that is parallel to the layer. As an example, the perpendicular polarizer 102 in FIG. 1 is in-plane. An advantage of having a device with a circular shape is that circles are far easier to fabricate than asymmetric shapes.

The orthogonal spin transfer magnetic random access memory device disclosed herein can employ a free layer with a large perpendicular magnetic anisotropy (PMA). The polarizing layer is magnetized in-plane, and thus provides an initial spin-transfer torque perpendicular to the preferred magnetization direction of the free layer the instant the device is energized with a write pulse. The perpendicular anisotropy of the free layer is sufficient that the free layer's lateral extend can be just 3 nm. That is, the free layer can be a thin film that is circular in cross-section and 3 nm in diameter and a few nanometers thick (0.8 to 3 nm), while still being substantially stable against random thermal fluctuations. The condition for stability is that the energy barrier to reverse the magnetization direction K be much greater than the thermal energy $k_BT$, $K/k_BT>60$, where T is the device operating temperature, typically less than 450 K and $k_B$ is Boltzmann's constant.

FIG. 1 shows an orthogonal spin transfer magnetic random access memory device 100 in accordance with an illustrative implementation. From bottom to top: there is an in-plane magnetized polarizing layer (P) 102, a non-magnetic layer (NM1-metallic or thin insulator) 104, the free layer (FL) 106 which has stable (storage) magnetic states oriented perpendicular to the plane of the layer, either up or down, a thin insulating layer 108, also called a tunnel barrier (NM2), and a reference layer (RL) 110 that is magnetized perpendicular to the plane of the layer. The in-plane magnetized polarizing layer 102 has a magnetic state that is oriented parallel to the plane of the layer. This layer 102 can be pinned, such that the magnetic state remains parallel to the plane of the layer when current or voltage is applied to the device.

Figure 2:
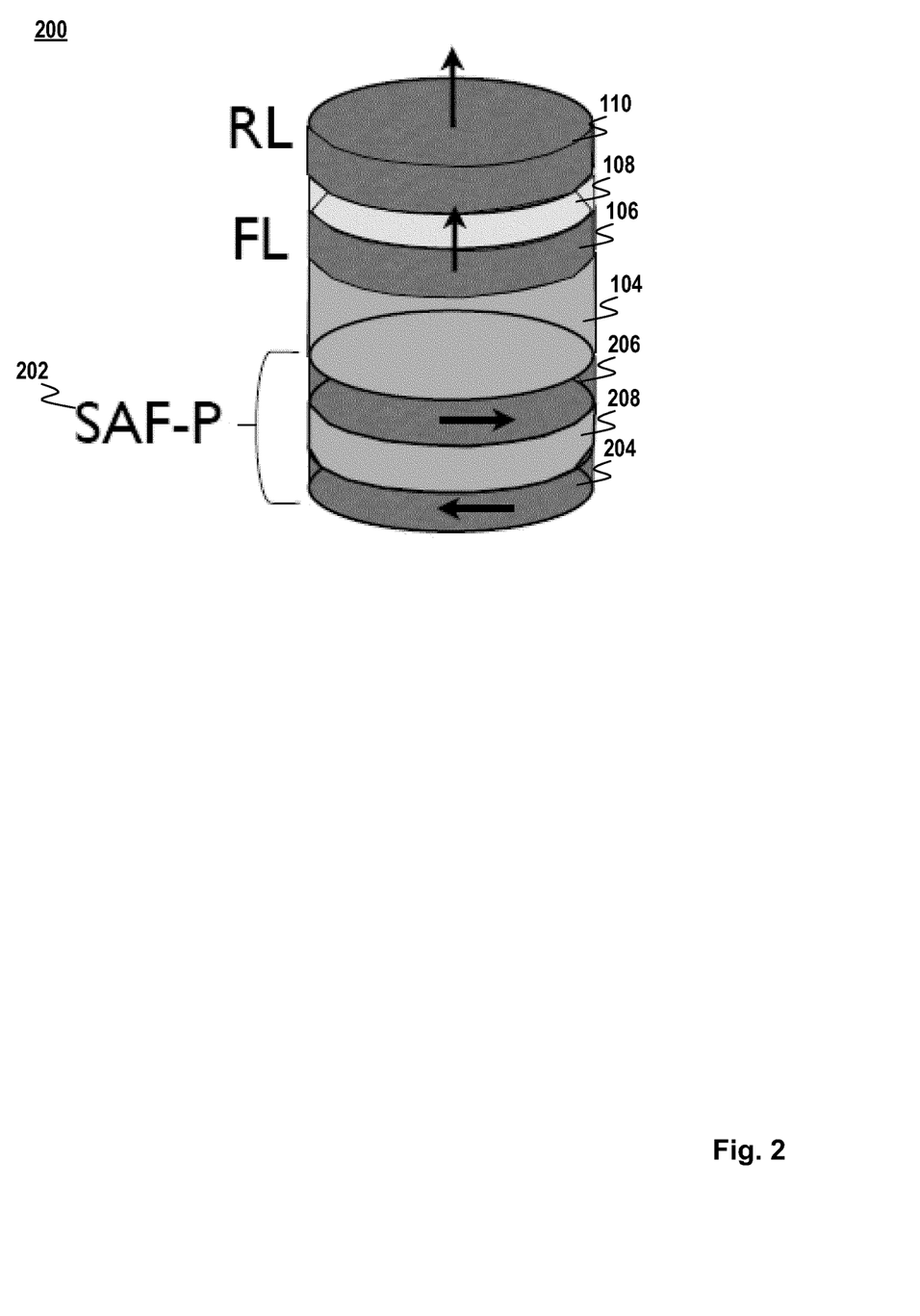
FIG. 2 shows an orthogonal spin transfer magnetic random access memory device with a polarizing magnetic layer that includes a synthetic antiferromagnet layer in accordance with an illustrative implementation.

FIG. 2 shows a device 200 with a polarizing magnetic layer (P) that includes a synthetic antiferromagnet (SAF) layer 202. The SAF layer 202 has two magnetic layers 204 and 206 that are separated by a non-magnetic metallic later 208. The magnetic layers 204 and 206 interact antiferromagnetically and thus form magnetic states with their magnetizations oriented opposite to one-another. One of the magnetic layers 204 (the lower one in FIG. 2—but, in general, the one that is furthest from the FL 106) can be placed into contact with an antiferromagnetic to pin (i.e. set) the direction of this magnetic layer 204. The magnetic layers 204 and 206 can be coupled antiferromagnetically. Then the magnetization direction of the magnetic layer 206 will be antiparallel to the magnetization of magnetic layer 204. Note while the polarizer 202 is indicated as being on the bottom of the layer stack 200, the stack can in inverted without changing any essential aspect of this invention disclosure.

Figure 3:
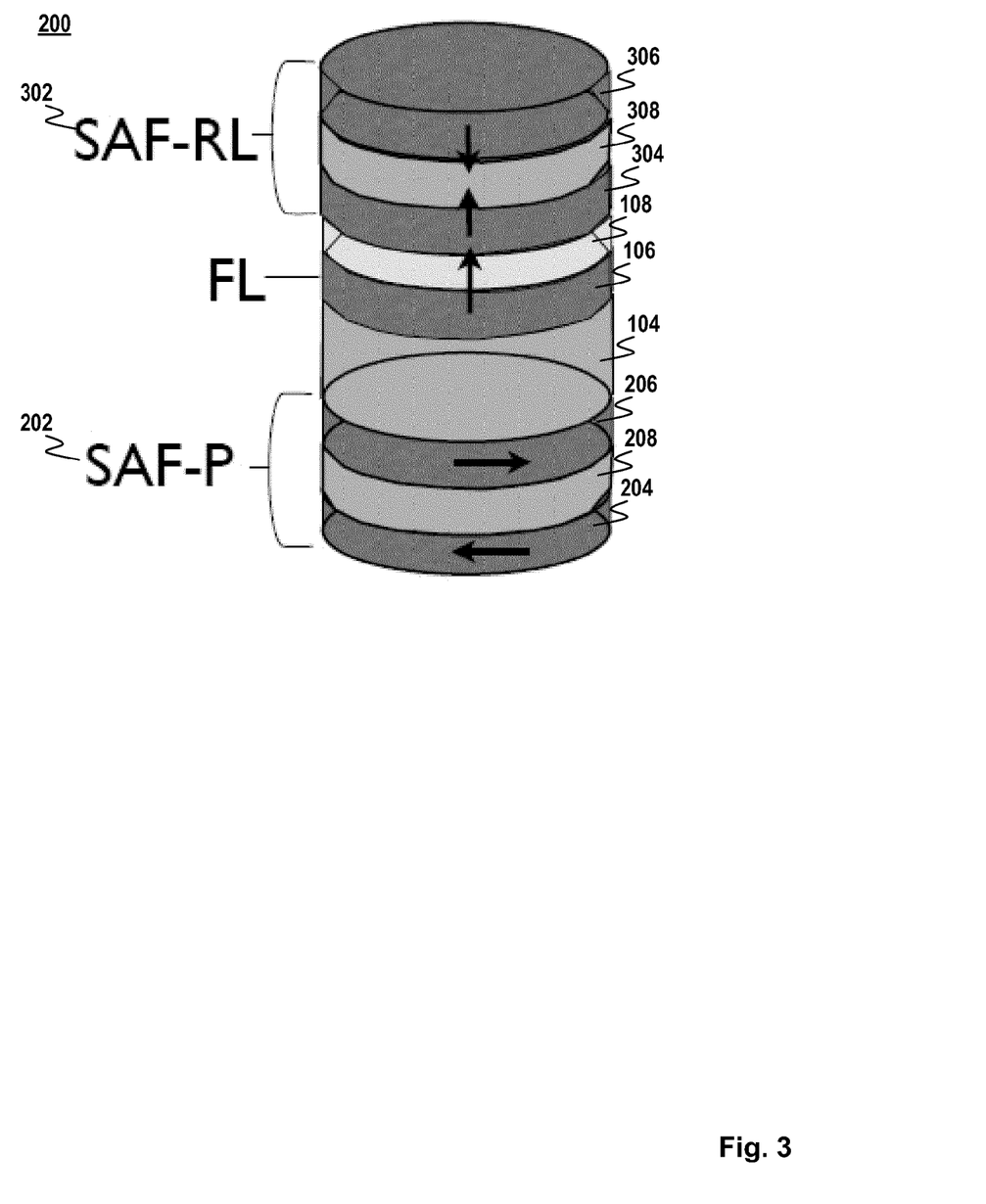
FIG. 3 shows an orthogonal spin transfer magnetic random access memory device with a reference layer that includes a synthetic antiferromagnet layer in accordance with an illustrative implementation.

FIG. 3 shows a device 300 with a reference magnetic (RL) layer 302 that consists of a synthetic antiferromagnet (SAF) layer. The SAF layer 302 has two perpendicularly magnetized layers 304 and 306 that are separated by a non-magnetic metallic later 308. The magnetic layers interact antiferromagnetically and thus form states in which the layer magnetizations are oriented opposite to one-another. One of the magnetic layers 306 (the upper one in FIG. 3—but, in general, the one that is furthest from the FL) can be put in contact with an antiferromagnetic that can be used to pin (i.e. set) the direction of this magnetic layer 306. The antiferromagnetic layer, however, is not needed for a perpendicularly magnetized SAF. That is, the antiferromagnetic layer is not required to pin the direction of the magnetic layer 306, because the magnetic anisotropy of the layers 302 can be sufficient to fix the magnetization directions of these layers 302.

The layer structures shown in FIGS. 2 and 3 can be used to optimize device preference. First, the SAF layers 202 and/or 302 allow the magnetic interactions between these layers 202 and/or 302 and the free layer 106 to be configured for various performance needs. The SAF RL structure (the thicknesses of the magnetic and non-magnetic layers comprising the SAF) can be used to produce a magnetic field that acts on the free layer 106. This magnetic field can balance the switching currents for anti-parallel (AP) to parallel (P) and P to AP. For example, if the switching current is larger for the P to AP transition then the magnetic field from the RL SAF can be set to be parallel to FL magnetization in the AP state. This can be accomplished by making the magnetic layer 304 in proximity to the free layer 106 within the SAF RL 302 thinner or of a lower magnetization density material than the other magnetic layer 306 in the SAF. In this implementation, the amplitude and the switching current can be significantly the same for switching the device from P to AP and also from AP to P. The currents are significantly the same when only the current polarity needs to be reversed between switching from P to AP and AP to P. The current magnitude can be the same. This enables use of the same driving circuits for switching from P to AP and from AP to P. In these implementations, the polarity of the current determines the device state.

As an example of balancing the switching currents, the SAF RL structure can have a preference for the P state of the device. Accordingly, less current is needed to switch to the P state compared to switching to the AP state. To balance the current, such that the same amount of current is needed to switch to either state, the SAF RL layer can be modified in various different wants. These modifications introduce some asymmetry in the SAF RL layer. In one implementation, the magnetic layer 306 can be made thicker. In other implementations, the magnetic layer 304 can be made thinner and/or can be made of a material with a lower magnetic moment density. Two or more of these changes can be made to a single device to balance the switching currents. An initial SAF-RL that would have a preference for the P state of the device consists of magnetic layers 304 and 306 with the same or significantly similar magnetization densities but with layer 304 being thicker than layer 306. Each layer, for example could be composed of [0.3 nm Co/0.9 nm Pt] units repeated N1 times for layer 304 and N2 times for layer 306 with N1 greater than N2. A modified SAF-RL would have layer 306 thicker than layer 304 or, as in the [0.3 nm Co/0.9 nm Pt] example given above, N2 would be greater than N1. In the modified SAF-RL the net magnetic field acting on layer FL 106 would be opposite the direction of the magnetization of layer 304 and thus favor the AP state. Another example would have layers with different magnetization densities but with similar thicknesses. Layer 304 could be composed of [0.3 nm Co/0.9 nm Pt]×N while layer 306 could be composed of [0.5 nm Co/0.8 nm Pt]×N (with "×N" meaning the that bilayer of Co/Pt is repeated N times). As the magnetization density [0.5 nm Co/0.8 nm Pt] is larger than that of [0.3 nm Co/0.9 nm Pt] this modified SAF-RL would lead to a net field on FL layer 106 that is opposite the magnetization of layer 304 thus favoring the AP state of the device. Having the switching currents balanced allows for reduced complexity in the driving circuitry.

The devices of various implementations are scalable because the free layer consists of a thin film material with a large perpendicular magnetic anisotropy (PMA). The energy barrier that determines the stability of the magnetic storage states is proportional the magnetic anisotropy and the volume of the element. The larger the magnetic anisotropy the smaller the volume of the element can be. For fixed element thickness (~2 nm) this means that the lateral size of the element can be reduced. Examples of materials with large perpendicular magnetic anisotropy are FeCoB in contact with MgO (due to an interface PMA at the FeCoB/MgO interface). Fe/Pt, Co/Ni, Fe/Pd, Fe/Pt, Co/Pt and CoPd multilayers. The hard-disk industry uses CoFeCr alloys as the media which have large PMA. FePt when formed in the L10 phase has among the highest PMA of any transition metal magnet. For example, with the PMA of FePt L10 multilayers, elements that are 2 nm in thickness and 3 nm in diameter are thermally stable, i.e. have energy barriers K to magnetization reversal greater than $60k_BT$ (K>60 times the thermal energy at room temperature (T=300 K)).

Multiple devices can be integrated into a memory array capable of storing multiple bits of data. For example, multiple devices can be grown together on a single chip that can be used as memory to store data.

Physical Model of Device

The magnetization dynamics of the device of one implementation can be modeled to a good approximation by considering the spin transfer torques associated with the perpendicular polarizer and the reference layer as follows:

$$\frac{d\hat{m}}{dt} = -\gamma\mu_0 \hat{m} \times \vec{H}_{eff} + \alpha\hat{m} \times \frac{d\hat{m}}{dt} + \sin(S)\gamma a_J \hat{m} \times (\hat{m} \times \hat{m}_P) - \cos(S)\gamma a_J \hat{m} \times (\hat{m} \times \hat{m}_R)$$

(Eqn. 1), where m represents the magnetization direction of the free layer (it is a unit vector in the direction of the free layer magnetization), and $\alpha$ is the damping parameter of the free layer. The prefactor, $a_J$, depends on the current density J, the spin-polarization P of the current density J, and the cosine of the angle between the free and pinned magnetic layers, $\cos(\theta)$, such that $a_J = \hbar Jg(P, \cos(\theta))/(2eMt)$, where h is the reduced Planck's constant, g is a function of the spin-polarization P and $\cos(\theta)$, M is the magnetization density of the free layer, e is the electron charge, and t is the thickness of the free layer. The last two terms are the spin transfer from the in-plane polarizer ($m_P$) and the perpendicular magnetized reference layer ($m_R$). tan(S) represents the ratio of the magnitude of these two spin transfer torques.

The magnetic energy of the free layer is given by:

$$U(m) = -K[(\hat{n}_K \cdot m)^2 + 2h \cdot m] \quad \text{(Eqn. 2)}$$

where $h = H_{ext}/H_K$ is the reduced applied field and HK is the anisotropy field given by the relation: $K = (\frac{1}{2})M_S V H_K$. $n_K$ is a unit vector in the direction of the magnetic easy axis of the FL, i.e. perpendicular to the layer plane.

And the effective field in Eqn. 1 is derived from Eqn. 2 as follows:

$$H_{eff} = -\frac{1}{M_s V}\nabla_m U(m) = H_k[(\hat{n}_k \cdot m)\hat{n}_k + h]. \quad \text{(Eqn. 3)}$$

Analysis of Eqns. 1 to 3 shows that there is a threshold current for the switching of the magnetization direction from aligned parallel to the direction $\hat{n}_K$ to antiparallel to $\hat{n}_K$ and vice-versa. For currents larger than or equal to this threshold value, the initial magnetization state is unstable and will eventually decay into the complementary state. The larger the current above this threshold value the faster the magnetization decay rate. Fast device writing generally requires currents larger than the threshold value. The decay rate is increased in the presence of thermal noise, which can aid the write process.

Threshold values of the current are given by:

$$I_{c0} = \frac{2e}{\hbar}\frac{\alpha}{P}K, \quad \text{(Eqn. 4)}$$

for $g(P, \cos(\theta)) = P$, that is the function g is a constant equal to P, the spin polarization of the current. In general $I_{co}$ will depend on the form of the function g. When g depends on the angle $\theta$ there can be different threshold currents for switching from P to AP and AP to P.

In order to describe the device writing process, thermal fluctuations of the magnetization must be included in the physical model of the device. This is included by adding a Langevin field to the effective field:

$$H_{eff} \rightarrow H_{eff} + H_{th} \quad \text{(Eqn. 5)}$$

where $H^{th}$ is a Gaussian distributed random magnetic field that represents the thermal noise associated with the switchable layer being at a temperature T:

$$\langle H_{th} \rangle = 0$$

$$\langle H_{th,i}(t)H_{th,k}(t')\rangle = 2D\delta_{i,k}\delta(t-t') \quad \text{(Eqn. 6a and 6b).}$$

The quantity D is given by:

$$D = \frac{\alpha k_B T}{2K(1+\alpha^2)} = \frac{\alpha}{2(1+\alpha^2)\xi}. \quad \text{(Eqn. 7)}$$

The value $\xi$ is introduced as $K/k_B T = \xi$, so that $\xi$ is the ratio of the energy barrier to the reversal of the magnetization divided by the thermal energy. As noted above, $\xi$ is typically larger that 60 for long term stability of the device memory states.

The write error rate of the device can be determined by solving the stochastic differential equations (Eqn. 1 to 7) numerically using parallel computational methods based in graphical processing units simulated in parallel on an NVidia Tesla C2050 graphics card. The large number of necessary random numbers were generated by employing a combination of the three-component combined Tausworthe "taus88" 16 and the 32-bit "Quick and Dirty" LCG17.

Figure 4:
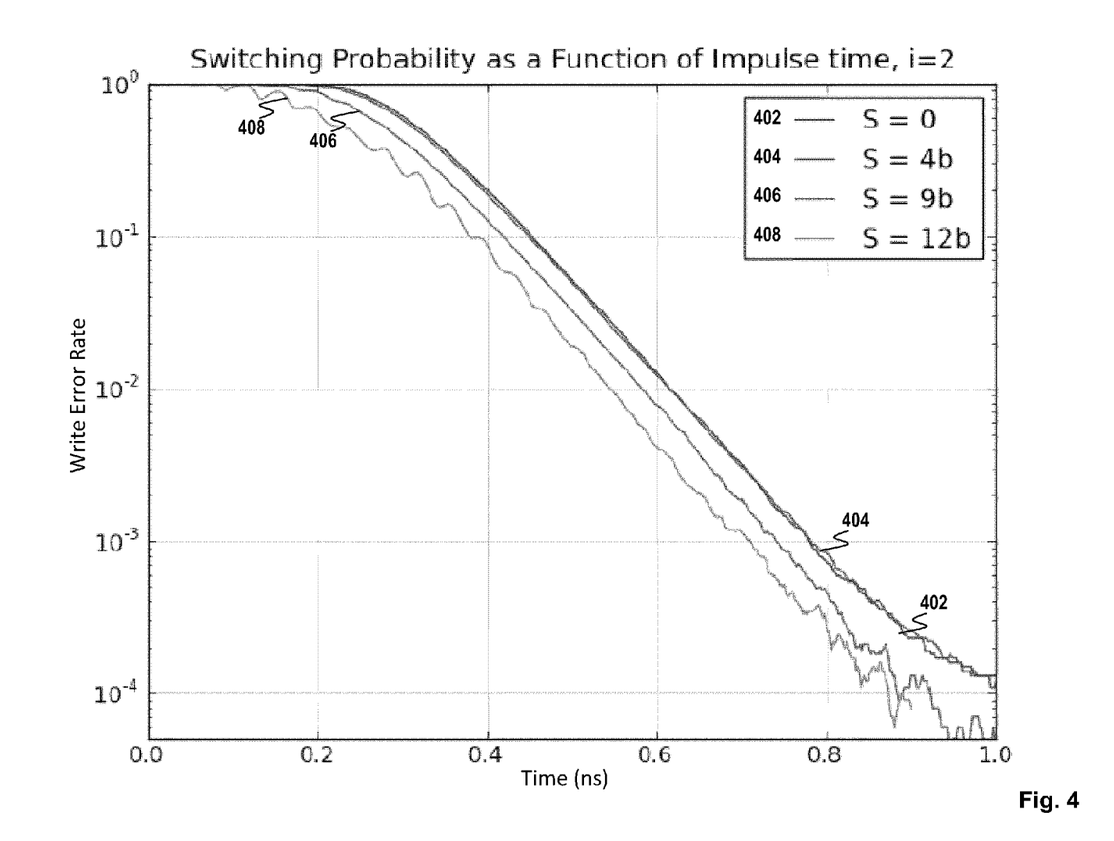
FIG. 4 shows the write error rate (WER) as a function of pulse duration for a pulse amplitude $i=I/I_{c0}=2$, a current amplitude of twice the threshold current in accordance with an illustrative implementation.

FIGS. 4-7 show the results of these calculations and methods to optimize device performance. FIG. 4 shows the write error rate (WER) as a function of pulse duration for a pulse amplitude $i = I/I_{c0} = 2$, a current amplitude of twice the threshold current. Results are shown for different ratios of the spin transfer torques from the polarizer and reference layer, the parameter S. Larger values of S give a reduced WER. For example, for a 1 ns pulse the WER can be reduced by a factor of 5 by increasing S from 0 to 9b, where b is $\pi/36$.

Figure 5:
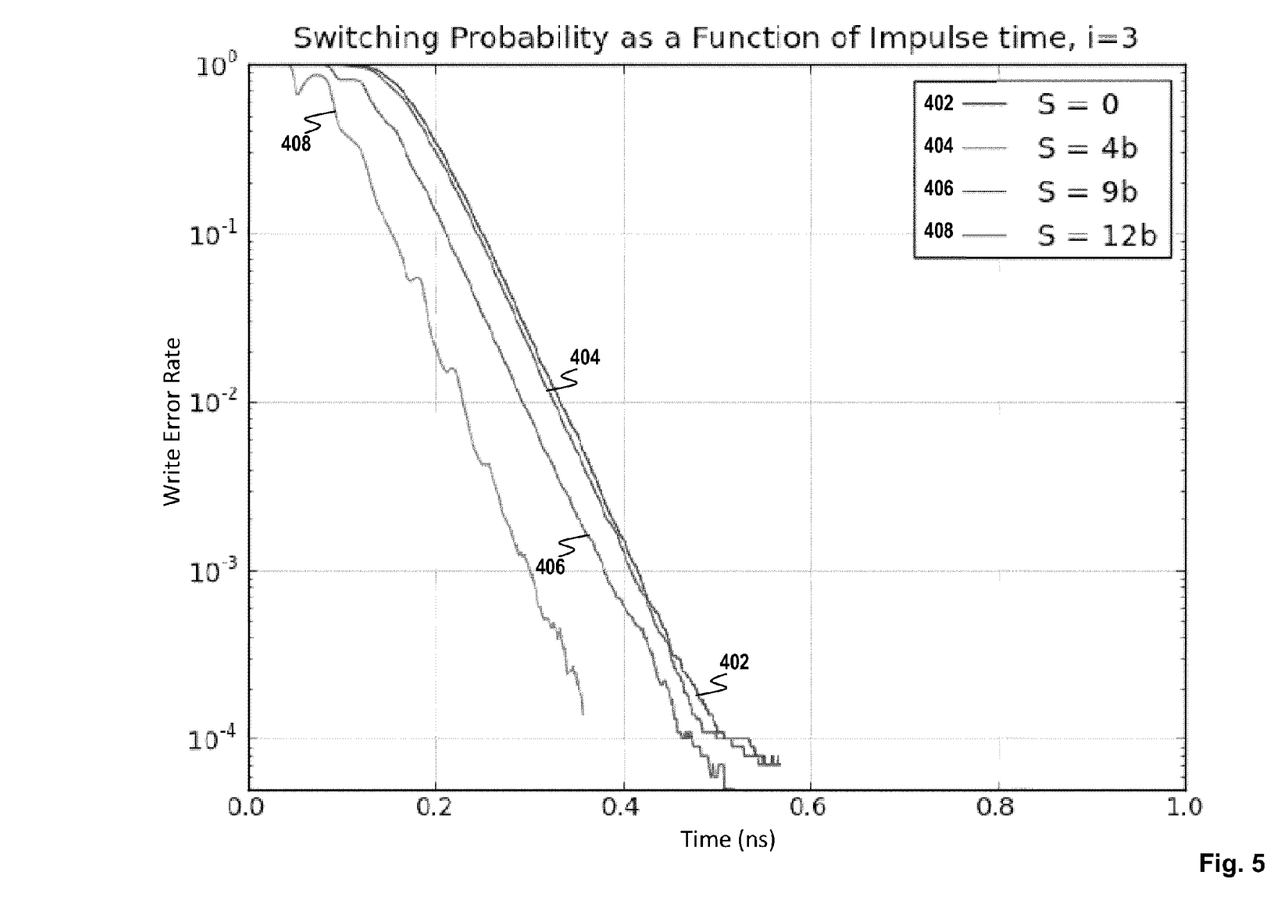
FIG. 5 shows the write error rate (WER) as a function of pulse duration for a pulse amplitude $i=I/I_{c0}=3$ in accordance with an illustrative implementation.

FIG. 5 shows the write error rate (WER) as a function of pulse duration for a pulse amplitude $i = I/I_{co} = 3$.

Figure 6:
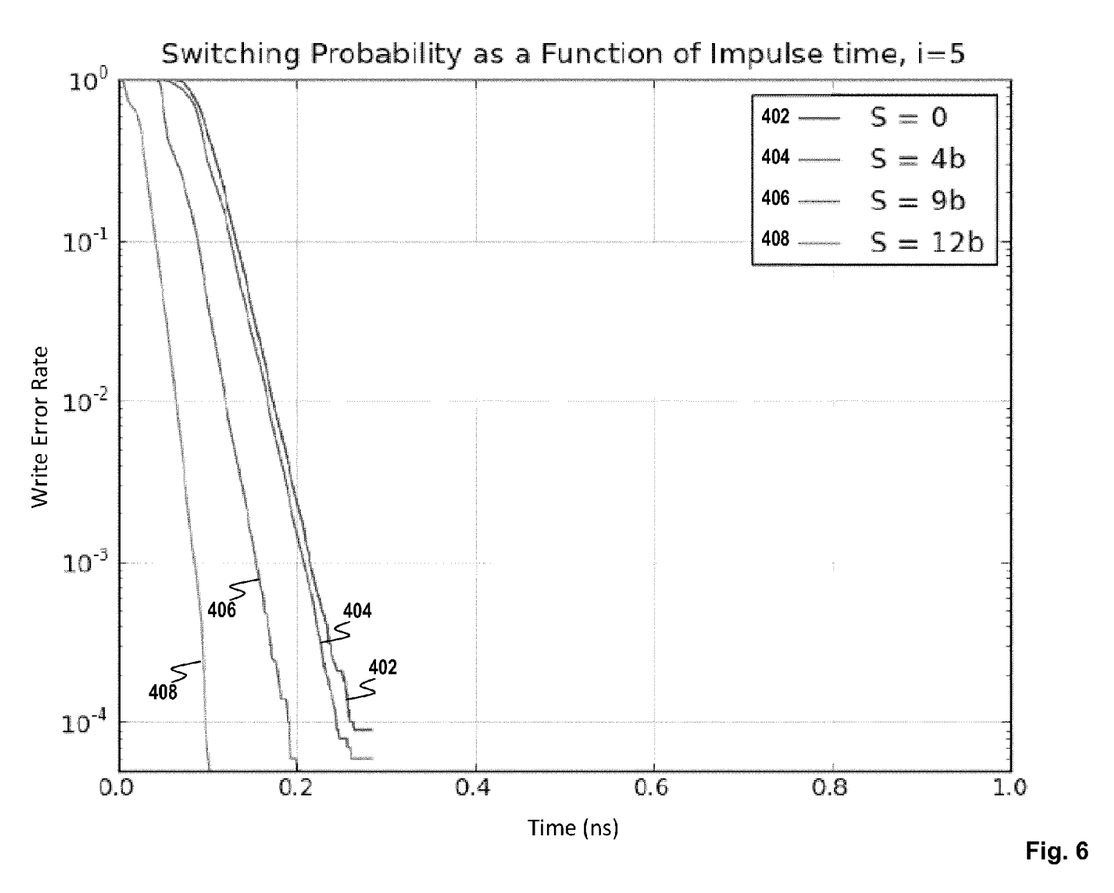
FIG. 6 shows the write error rate (WER) as a function of pulse duration for a pulse amplitude $i=I/I_{c0}=5$ in accordance with an illustrative implementation.

FIG. 6 shows the write error rate (WER) as a function of pulse duration for a pulse amplitude $i = I/I_{co} = 5$.

Figure 7:
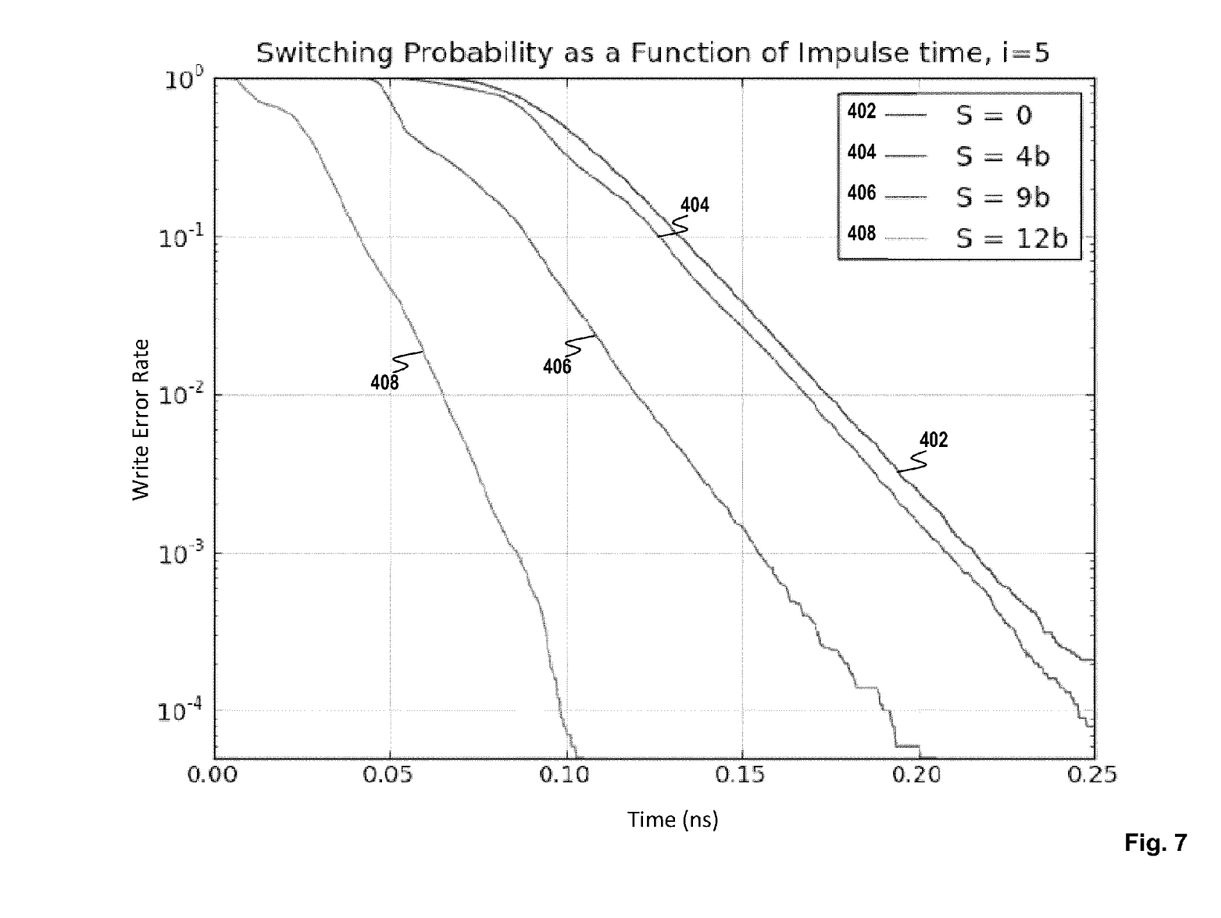
FIG. 7 shows the write error rate (WER) as a function of pulse duration for a pulse amplitude $i=I/I_{c0}=5$ with an expanded×(time) axis, 0 to 0.25 ns in accordance with an illustrative implementation.

FIG. 7 shows the write error rate (WER) as a function of pulse duration for a pulse amplitude $i = I/I_{co} = 5$ with an expanded ×(time) axis, 0 to 0.25 ns.

These results show that increasing S can greatly reduce the WER for sub-1 ns pulses. The effect is very significant as the current pulse amplitude is increased. For example, for i=3 the WER can be reduced by a factor of 30 for pulses between 0.1 and 1 ns when S is increased from 0 to 12b. For i=5 the WER is reduced by a factor of 10,000 for the same time range when S is increased from 0 to 12b. These are very significant effects and reducing the WER at these time scales can reduce a memory array's complexity (for example, less error correction circuitry is needed in the memory array).

Having a free layer that is perpendicular to the plane of the device, as shown in FIGS. 1-3, eliminates or greatly reduces the precessional switching of device's state that can occur at high currents. In some orthogonal spin transfer magnetic random access memory devices, when a sufficiently large current or voltage is applied, the spin-transfer torque of the polarizer can lead to a torque that rotates the free layer magnetization out of the free layer's plane. This can then produce a demagnetization field perpendicular to the free layer's plane around which the free layer magnetization precesses. Precession can occur for both signs of the current, since in both cases the free layer magnetization is tilted out of the free layer's plane. The free layer magnetization rotation about its demagnetizing field will result in a switching probability of the free layer's magnetic state that is a nonmonotonic function of the pulse amplitude or duration, since if the pulse ends after the free layer magnetization finishes a full rotation (i.e., a $2\pi$ rotation), the probability of switching will be reduced. Eliminating or greatly reducing precessional switching means the magnetic state of the free layer will not precess. Accordingly, the timing of the current pulse is not required to be as exact as compared to the timing requirements when precessional switching can occur, e.g., when the magnetization vector of the free layer is parallel to the plane of the free layer.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Thus, particular implementations of the subject matter have been described. Other implementations are within the scope of the following claims.

What is claimed is:

1. A magnetic device comprising:
   a pinned polarizing magnetic layer having a magnetic vector parallel to a plane of the pinned polarizing magnetic layer;
   a free layer, separated from the polarizing magnetic layer by a first non-magnetic layer, having a magnetization vector with a changeable magnetization direction, wherein the changeable magnetization vector has a state that changes to a first state upon application of a first current of a first polarity and that changes to a second state upon application of a second current of a second, opposite polarity; and
   a reference layer having a magnetic vector perpendicular to the plane of the reference layer and separated from the free layer by a second non-magnetic layer, wherein the reference layer and the pinned polarizing magnetic layer balances is an amplitude of current required to change the changeable magnetization vector state such that the amplitude of the first current is significantly the same as the amplitude of the second current, and wherein the reference layer comprises:
   a first magnetic layer that has a first magnetization vector oriented perpendicular to the first magnetic layer; and
   a second magnetic layer, separated from the first magnetic layer by a reference layer non-magnetic layer, that has a second magnetization vector oriented perpendicular to the second magnetic layer and opposite of the first magnetization vector, wherein widths of the first magnetic layer and the second magnetic layer are different and balance the amplitude of current required to change the changeable magnetization vector state.

2. The magnetic device of claim 1, wherein the magnetic device is between 3 nanometers and 10 nanometers in height.

3. The magnetic device of claim 1, wherein the changeable magnetization vector changes to the first state based upon a pulse of the first current between 0.1 nanoseconds and 0.8 nanoseconds.

4. The magnetic device of claim 3, wherein the changeable magnetization vector changes to the second state based upon a pulse of the second current between 0.1 nanoseconds and 0.8 nanoseconds.

5. The magnetic device of claim 4, wherein the pinned polarizing magnetic layer has a first spin torque and the reference layer has a second spin torque, and wherein a ratio of the first spin torque and the second spin torque reduces write error rates.

6. The magnetic device of claim 5, wherein the ratio of the first spin torque and the second spin is between 0.36 and 1.8.

7. The magnetic device of claim 1, wherein the magnetic device has a circular cross section.

8. A memory array comprising:
   a plurality of memory cells, wherein each memory cell comprises:
   a pinned polarizing magnetic layer having a magnetic vector parallel to a plane of the pinned polarizing magnetic layer;
   a free layer, separated from the polarizing magnetic layer by a first non-magnetic layer, having a magnetization vector with a changeable magnetization direction, wherein the changeable magnetization vector changes to a first state upon application of a first current of a first polarity and to change to a second state upon application of a second current of a second, opposite polarity; and
   a reference layer having a magnetic vector perpendicular to the plane of the reference layer and separated from the free layer by a second non-magnetic layer, wherein the reference layer and the pinned polarizing magnetic layer balances an amplitude of current to change the changeable magnetization vector state such that the amplitude of the first current is the same as the amplitude of the second current, and wherein the reference layer comprises:
   a first magnetic layer has a first magnetization vector oriented perpendicular to the first magnetic layer; and
   a second magnetic layer, separated from the first magnetic layer by a reference layer non-magnetic layer, has a second magnetization vector oriented perpendicular to the second magnetic layer and opposite of the first magnetization vector, wherein widths of the first magnetic layer and the second magnetic layer are different and balance the amplitude of current required to change the changeable magnetization vector state.

9. The memory array of claim 8, wherein each of the memory cells is between 3 nanometers and 10 nanometers in height.

10. The memory array of claim 8, wherein the changeable magnetization vector of each of the memory cells changes to the first state based upon a pulse of the first current between 0.1 nanoseconds and 0.8 nanoseconds.

11. The memory array of claim 10, wherein the changeable magnetization vector of each of the memory cells changes to the second state based upon a pulse of the second current between 0.1 nanoseconds and 0.8 nanoseconds.

12. The memory array of claim 11, wherein the pinned polarizing magnetic layer of each of the memory cells has a first spin torque and the reference layer of each of the memory cells has a second spin torque, and wherein a ratio of the first spin torque and the second spin torque reduces write error rates.

13. The memory array of claim 12, wherein the ratio of the first spin torque and the second spin is between 0.36 and 1.8.

14. The memory array of claim 8, wherein each of the memory cells has a circular cross section.

* * * * *